(12) United States Patent
Kobrinsky et al.

(10) Patent No.: US 10,707,186 B1
(45) Date of Patent: Jul. 7, 2020

(54) COMPLIANT LAYER FOR WAFER TO WAFER BONDING

(71) Applicant: Intel Corporation, Santa Clara, CA (US)

(72) Inventors: Mauro J. Kobrinsky, Portland, OR (US); Jasmeet S. Chawla, Hillsboro, OR (US); Stefan Meister, Portland, OR (US); Myra McDonnell, Portland, OR (US); Chytra Pawashe, Beaverton, OR (US); Daniel Pantuso, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/125,261

(22) Filed: Sep. 7, 2018

Related U.S. Application Data

(60) Provisional application No. 62/559,352, filed on Sep. 15, 2017.

(51) Int. Cl.
 *B32B 37/02* (2006.01)
 *H01L 23/00* (2006.01)

(52) U.S. Cl.
 CPC .............. *H01L 24/83* (2013.01); *H01L 24/75* (2013.01); *H01L 24/94* (2013.01); *H01L 2224/7555* (2013.01); *H01L 2224/83048* (2013.01); *H01L 2224/83948* (2013.01)

(58) Field of Classification Search
 CPC ......... H01L 21/67092; H01L 21/67103; H01L 21/67109
 USPC ........................................................ 438/457
 See application file for complete search history.

(56) References Cited

U.S. PATENT DOCUMENTS

| | | | | |
|---|---|---|---|---|
| 2007/0287264 A1* | 12/2007 | Rogers | .................. | H01L 21/187 438/457 |
| 2008/0006938 A1* | 1/2008 | Patti | .................. | H01L 21/76898 257/734 |
| 2012/0006463 A1* | 1/2012 | Gaudin | .................. | H01L 21/187 156/64 |
| 2013/0106533 A1* | 5/2013 | Ayazi | .................. | H03H 3/0072 333/186 |
| 2017/0053823 A1* | 2/2017 | Huang | .............. | H01L 21/67092 |

* cited by examiner

*Primary Examiner* — Long K Tran

(74) *Attorney, Agent, or Firm* — Green, Howard, & Mughal LLP

(57) ABSTRACT

Techniques and mechanisms for forming a bond between wafers using a compliant layer. In an embodiment, a layer or layers of one or more compliant materials is provided on a first surface of a first wafer, and the one or more compliant layers are subsequently bonded to a second surface of a second wafer. The bonded wafers are heated to an elevated temperature at which a compliant layer exhibits non-elastic deformations to facilitate relaxation of stresses caused by wafer distortions. In another embodiment, a material of the compliant layer exhibits viscoelastic behavior at room temperature, wherein stress is mitigated by allowing wafer distortion to relax at room temperature.

8 Claims, 8 Drawing Sheets

COMPLIANT LAYER FOR WAFER TO WAFER BONDING

CROSS REFERENCE TO RELATED APPLICATIONS

This non-provisional patent application is related to, and claims priority to, the U.S. provisional application entitled "COMPLIANT LAYER FOR WAFER TO WAFER BONDING," filed Sep. 15, 2017, having an application Ser. No. 62/559,352, the entire contents of which are incorporated herein by reference.

BACKGROUND

1. Technical Field

Embodiments of the invention generally relate to wafer to wafer bonding, and more particularly relate to wafer to wafer bonding using a compliant layer for reduced distortion.

2. Background Art

In current wafer to wafer bonding, two wafers may be brought into close proximity to one another (e.g., with surfaces thereof about 30 to a few hundred microns apart) and bonding may be initiated by locally deforming one of the wafers to make local contact between the wafers. The wafers then bond to one another via propagation of the local contact to full bonding of the wafers. Such techniques provide undesirable distortions in one or both of the wafers and/or undesirable stress between the wafers.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
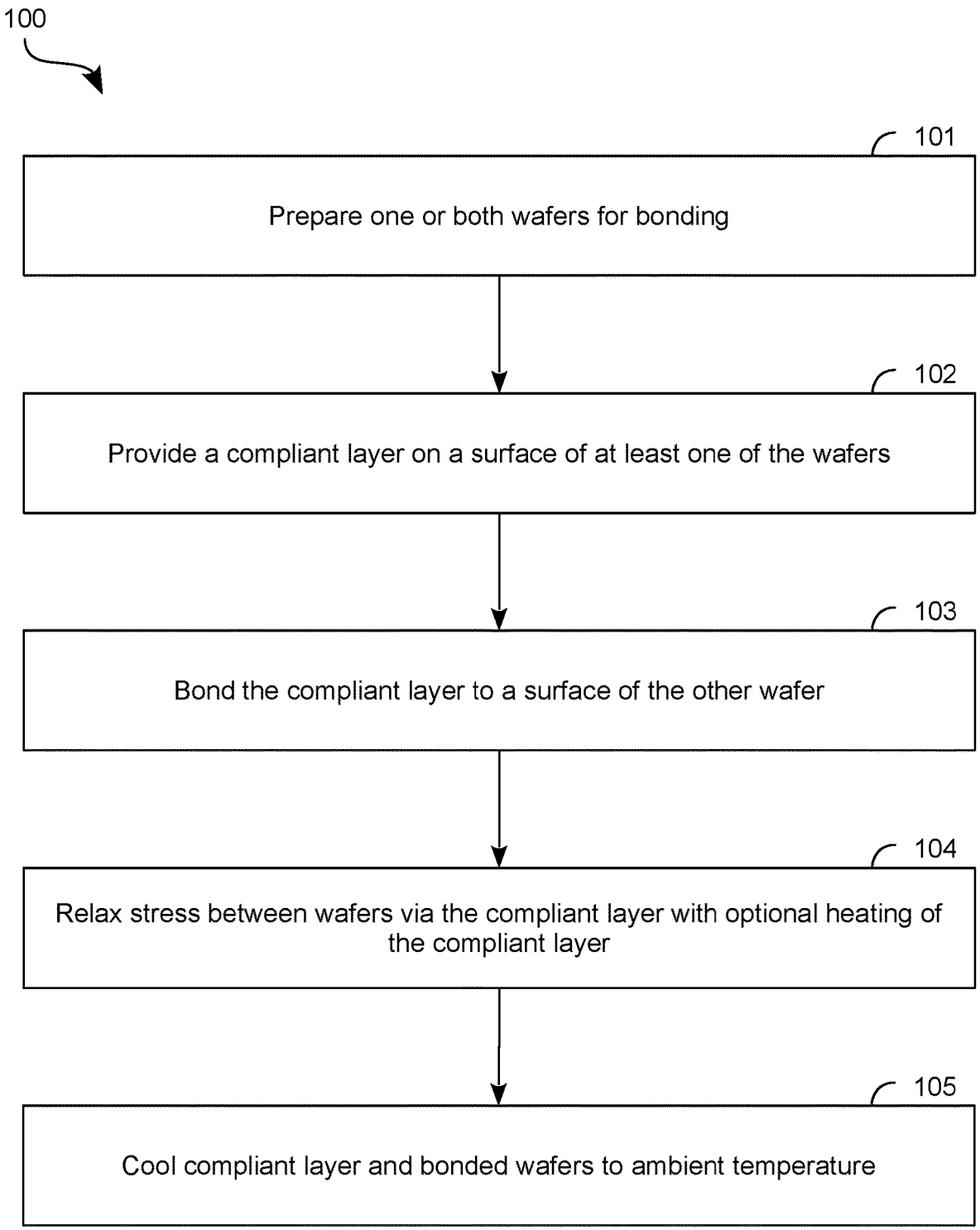
FIG. 1 illustrates a flow diagram showing elements of a process for bonding wafers using a compliant layer according to an embodiment.

Embodiments described herein variously provide techniques and mechanisms for wafer to wafer bonding using a compliant layer for reduced distortion. As is described further herein, in some embodiments, a method for bonding wafers includes providing a compliant layer on a first surface of a first wafer, bonding the compliant layer of the first wafer to a second surface of a second wafer, and heating the bonded wafers to an elevated temperature, such that at the elevated temperature, the compliant layer exhibits non-elastic deformations (e.g., visco-elastic or creep) that relaxes stress and accommodates the distortions caused by the bonding process. For example, after the bonding operation, disadvantageous stress and deformations may be present between the first and second wafers. Heating the compliant layer advantageously releases or relaxes the stress between the wafers such that undesirable distortion is removed.

In other embodiments, the material of the compliant layer exhibits viscoelastic behavior at room temperature, and therefore distortions can be eliminated by allowing the bonded wafers to relax at room temperature. In some embodiments (e.g., those using polymer materials for the compliant layer), a higher temperature or UV cure may be needed to increase the strength of the material (cross-linking or curing). The described compliant layer may be characterized as a visco-elastic layer, a stress-relaxing layer, a compliant bonding layer, a malleable layer, a malleable bonding layer, or the like. As described further herein, the compliant layer may be a single layer or it may include a stack of layers such that one or more of the layers are compliant or malleable at the elevated temperature as described herein. The described techniques significantly reduce or eliminate distortions caused to wafers during wafer bonding by providing a compliant layer between the wafers that allows the wafers to slip with respect to each another to relax the wafers to a non-stress state such that the non-stress state has low or no distortion. Such distortions (i.e., in plane distortions) cause registration during pattering post-bonding.

One or more embodiments or implementations are now described with reference to the enclosed figures. While specific configurations and arrangements are described, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the description of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

FIG. 1 illustrates a flow diagram showing an exemplary process 100 for bonding wafers using a compliant layer for reduced distortion, arranged in accordance with at least some implementations of the present disclosure. In the illustrated implementation, process 100 may include one or more operations as illustrated by operations 101-105. However, embodiments herein may include additional operations, certain operations being omitted, or operations being performed out of the order provided.

Process 100 begins at operation 101, where wafers are prepared for bonding. The wafers may include any suitable material or materials, substrates, device layers, metallization layers or the like. In an embodiment, one wafer is a device wafer (i.e., having devices formed on a surface thereof) and the other wafer is a carrier wafer. For example, one or both wafers may be or include monocrystalline silicon (Si), germanium (Ge), silicon germanium (SiGe), a III-V materials-based material (e.g., gallium arsenide (GaAs)), a silicon carbide (SiC), a sapphire ($Al_2O_3$), or any combination thereof. In various examples, one or both wafers may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like. The wafers may be prepared for bonding using any suitable technique or techniques. In an embodiment, one or both wafers are polished (i.e., the surfaces to be bonded are polished) prior to bonding. In an embodiment, the wafer surfaces to be bonded are deposited with silicon oxide layers and planarized using, for example, a chemical-mechanical polishing technique. In an embodiment, preparation for bonding includes chemical and physical surface treatment of bonding materials. In an embodiment, the compliant layer is thermally treated to eliminate volatiles (soft baked) before bonding. The wafer surfaces to be bonded may include any suitable material or materials. In an embodiment, one of the wafers to be bonded is a carrier wafer comprising a glass substrate.

Process 100 continues at operation 102, where a compliant layer is provided on the surface of one or both of the wafers. The compliant layer may include any material, materials, or materials stack described herein and the compliant layer may be formed using any suitable technique or techniques.

Figure 2:
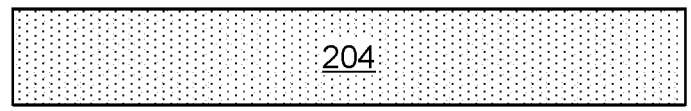
FIGS. 2 through 4 show cross-sectional side views each of a respective work piece arrangement to bond wafers according to a corresponding embodiment.
Figure 2:
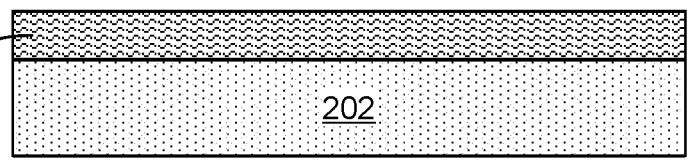

FIG. 2 illustrates a work piece arrangement 201 after the formation of a compliant layer on a surface of one of the wafers, arranged in accordance with at least some implementations of the present disclosure.

Figure 3:
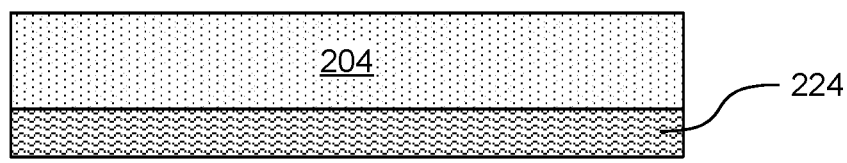
Figure 3:
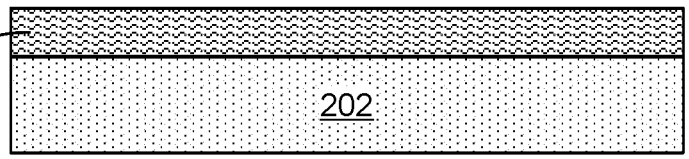

As shown in FIG. 2, a wafer 202 is to be bonded to a wafer 204. Also as shown, a compliant layer 222 has been formed on wafer 202. Compliant layer 222 may include any suitable material or material stack such that after bonding compliant layer 222 relaxes stress and accommodates the distortions caused by the bonding process. In an embodiment, compliant layer 222 includes a material or material stack such that, after bonding at first temperature (e.g., ambient temperature), upon heating of compliant layer 222, at least one material layer of compliant layer 222 is more malleable (deforms non-elastically) and compliant than one or both of wafers 202, 204. As is described further herein, such heating of compliant layer 222 may provide for the release or relaxation of stresses between wafers 202, 204 caused by bonding. In the illustrated embodiment of FIG. 2, compliant layer 222 is provided only on wafer 202. In other embodiments, a compliant layer may be provided only on wafer 204. In yet other embodiments, as shown in FIG. 3, a compliant layer may be provided on both wafers 202, 204. In other embodiments, the compliant layer may be buried below a bonded layer (e.g., a layer that is non-compliant but is optimized for enabling bonding).

FIG. 3 illustrates a work piece arrangement 301 after the formation of a compliant layer on a respective surface of each of wafers 202, 204, arranged in accordance with at least some implementations of the present disclosure.

As shown in FIG. 3, wafer 202 is to be bonded to wafer 204. Also as shown, compliant layer 222 has been formed on wafer 202 and compliant layer 224 has been formed on wafer 204. Compliant layers 222, 224 may include any suitable material or material stack such that, after bonding at first temperature (e.g., ambient temperature), upon heating of compliant layers 222, 224, at least one material layer of each of compliant layers 222, 224 is more malleable and compliant than one or both of wafers 202, 204. As is described further herein, such heating of compliant layers 222, 224 may provide for the release or relaxation of stresses between wafers 202, 204 caused by bonding.

As described, compliant layers 222, 224 may include any suitable material or material stack such that, after bonding, upon heating of compliant layers 222, 224, at least one material layer of each of compliant layers 222, 224 is more malleable and compliant than one or both of wafers 202, 204. Compliant layers 222, 224 may be the same materials or they may be different. Furthermore, compliant layers 222, 224 may have the same material stacks or they may be different. In an embodiment, compliant layers 222, 224 each have a facing surface (e.g., a top surface of compliant layer 222 and a bottom surface of compliant layer 224 in the illustration of FIG. 3 such that the layers on those surfaces are the same or substantially the same materials, which may aid in wafer to wafer bonding. However, in some embodiments, the layers on those surfaces may be different so long as bonding may be achieved.

As described compliant layers 222, 224 may be any suitable material or material layers or stack of materials. In an embodiment, one or both of compliant layers 222, 224 includes a metal layer to provide the described malleability at an elevated temperature with respect to the temperature of bonding. In the following, the layer of one or both of compliant layers 222, 224 that provides malleability (e.g., an entirety of one or both of compliant layers 222, 224 or a layer within compliant layers 222, 224) is characterized simply as a compliant layer. As described in an embodiment, the compliant layer is or includes a metal. In an embodiment, the compliant layer is or includes copper. In some embodiments, the compliant layer is or includes one or more of Al, Cu, Sn, In, Ag, Sn, a SnAg alloy, a SnCu alloy, or a SnCuAg alloy. In some embodiments, the compliant layer is or includes a polymer material (thermoplastics, thermosettings, elastomers, and hybrid polymers) that is deposited on the wafer by techniques such as spin-on and then cured or crosslinked using heat or UV treatments. Examples of such polymers include Benzocyclobutene (BCB), UV epoxies (e.g., SU8), Polydimethylsiloxane (PDMS), Methylsilsesquioxane (MSSQ), and Parylene-N. In other embodiments, the compliant layer is or includes a dielectric material such as a re-flowable dielectric such as SiOx and Si3Ny. As described herein, in some embodiments, only one of wafers 202, 204 includes a compliant layer while the other does not.

In some embodiments, one or both of compliant layers 222, 224 are provided across an entirety of or substantially an entirety of wafers 202, 204. In an embodiment, one or both of compliant layers 222, 224 have a pattern such as an array of lines of compliant material, a grid or other pattern of circles, squares, rectangles, ovals, or other shapes of compliant material. In an embodiment, one or both of compliant layers 222, 224 are patterned (with any of the described patterns) within a blanket layer that surrounds the patterned compliant layer. The blanket layer may surround the patterned compliant layer only in the lateral direction (e.g., leaving top and bottom surfaces of the patterned compliant layer exposed to adjacent materials or exposed for bonding) or in the lateral direction and over one or both surfaces of the patterned compliant layer.

Figure 4:
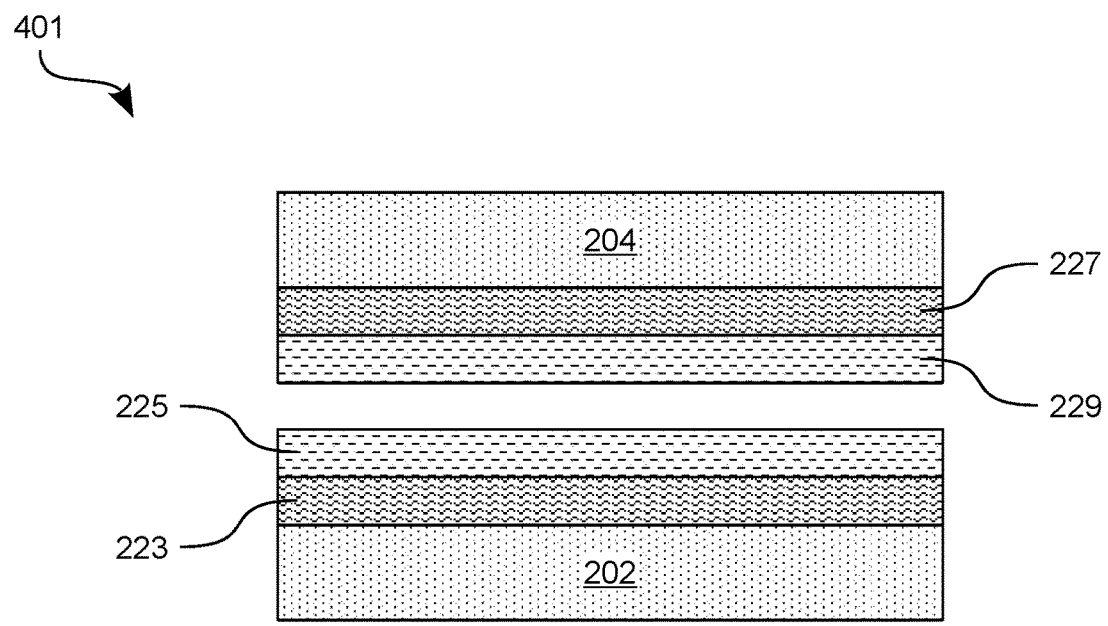

FIG. 4 illustrates a work piece arrangement 401 after the formation of one or more compliant layers on a respective surface of each of wafers 202, 204, arranged in accordance with at least some implementations of the present disclosure.

As shown in FIG. 4, wafer 202 is to be bonded to wafer 204. Also as shown, a layer 223 has been formed on wafer 202 and a layer 225 has been formed on layer 223. Furthermore, a layer 227 has been formed on wafer 204 and a layer 229 has been formed on layer 227. In the example, of FIG. 4, one or both of layers 223, 225 as well as one or both of layers 227, 229 may be compliant layers as characterized herein. In an embodiment, layers 223, 227 are compliant layers while layers 225, 229 are not compliant (i.e., at elevated temperatures, layers 225, 229 are not malleable to the point that they release stress between wafers 202, 204). In the embodiment of FIG. 4, layers 223, 227 may be selected for their compliant or malleable properties while layers 225, 229 may be selected for their properties of bonding therebetween. For example, upon heating of layers 223, 227, layers 223, 227 are more malleable and compliant than one or both of wafers 202, 204 as well as layers 225, 229. Thereby, layers 223, 227 may provide the described relaxation or release of stress between wafers 202, 204. For example, layers 223, 227 may include any materials as described with respect to compliant layers 222, 224. Layers 225, 229 may then be selected for their bonding characteristics (and optionally malleability) with the advantage of malleability and stress release being provided by layers 223, 227. For example, layers 225, 229 may be hard bonding layers including materials such as SiOx, SixNy, SiC.

In some embodiments, one or both of layers 225, 229 are provided across an entirety of or substantially an entirety of wafers 202, 204. In an embodiment, one or both of layers 225, 229 have a pattern such as an array of lines of material, a grid or other pattern of circles, squares, rectangles, ovals, or other shapes of material or the like. In an embodiment, one or both of layers 225, 229 are patterned (with any of the described patterns) within a blanket layer that surrounds the patterned layer. The blanket layer may surround the patterned layer only in the lateral direction (e.g., leaving top and bottom surfaces of the patterned compliant layer exposed to other materials or for bonding) or in the lateral direction and over one or both surfaces of the patterned layer. Furthermore, the patterning of compliant layers 222, 224 (and an optional blanket layer) may be implemented in one or both of layers 223, 227.

The described layers (i.e., compliant layers 222, 224 and layers 223, 225, 227, 229) may be formed using any suitable technique or techniques such as chemical vapor deposition, electroplating, metal organic chemical vapor deposition, atomic layer deposition, plasma enhanced chemical vapor deposition, physical vapor deposition, spin-on, or the like. Such techniques may be followed by optional planarization techniques, etch techniques, patterning techniques, or the like, to prepare for bonding.

Returning now to FIG. 1, process 100 continues at operation 103, where the compliant layer on one wafer is bonded to a surface of another wafer. As described, in some embodiments, the surface of the other wafer does not include a compliant layer (please refer to FIG. 2). In other embodiments, the surface of the other wafer includes a compliant layer (please refer to FIG. 3) or the surface includes a hard bonding layer over a buried compliant layer (please refer to FIG. 4). In any event, the compliant layer may be bonded to the surface of the other wafer using any suitable technique or techniques. In an embodiment, the compliant surface is brought within close proximity of the surface of the other wafer (e.g., 5-100 microns), regions of the wafers are contacted to bond the regions, and the bond propagates a bond between the wafers from the initially contacted center regions to fully bond the wafers.

Figure 5:
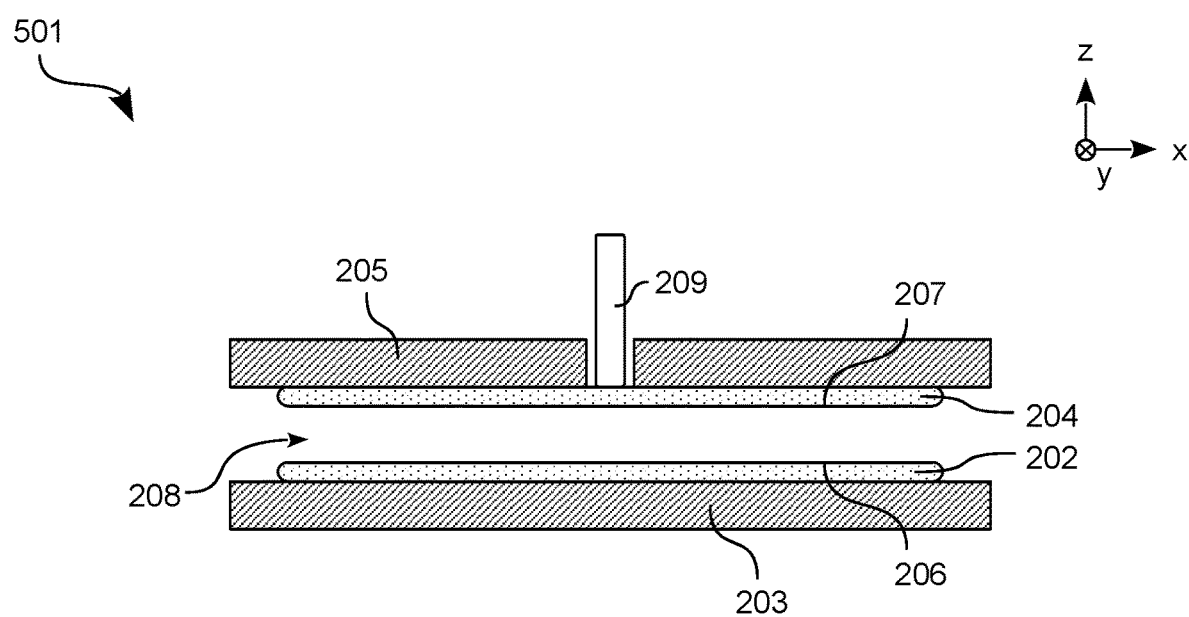
FIGS. 5 through 7 show cross-sectional side views each of a respective work piece arrangement during processing to bond wafers according to an embodiment.

FIG. 5 illustrates a work piece arrangement 501 after the wafers brought within close proximity of one another for bonding, arranged in accordance with at least some implementations of the present disclosure. The wafers may be brought into close proximity of one another using any suitable technique or techniques.

As shown in FIG. 5, wafer 202 is secured to and/or handled by a wafer holder 203 and wafer 204 is secured to and/or handled by a wafer holder 205 such that a surface 206 of wafer 202 is within close proximity of a surface 207 of wafer 204. For example, surface 206 and surface 207 may have a gap 208 therebetween of about 10-100 microns (i.e., a distance in the z-direction). Surface 206 may include a bare surface of wafer 202, compliant layer 222 or layers 223, 225 as described herein. Similarly, surface 207 may include a bare surface of wafer 204, compliant layer 224 or layers 227, 229 as described herein.

Also as shown in FIG. 5, a wafer deformer 209 is provided such that wafer deformer 209 may protrude from wafer holder 205 to deform wafer 204 as described herein. In the illustrated embodiment, a physical pin is used as the wafer deformer. In other embodiments, the wafer can be deformed by applying pressure to the wafer or by deforming wafer holder 205 chuck (i.e., by using a deformed chuck or by deforming the chuck).

Wafer holders 203, 205 may be any suitable wafer holders such as chucks or the like. In an embodiment, wafer holders 203, 205 are vacuum chucks. In an embodiment, wafer 204 is loaded and aligned onto wafer holder 205 and wafer 204 is held in an aligned position on a face of wafer holder 205 by a vacuum applied to vacuum channels therein. Similarly, wafer 202 may be loaded and aligned onto wafer holder 203 and wafer 202 may be held in an aligned position on the face of wafer holder 203 by a vacuum applied to vacuum channels therein. In other embodiments, wafer 202 is held by wafer holder 203 by electrostatic force, a clamp, or the like. Furthermore, in some embodiments, wafer 204 may be held within close proximity by pins, support structures around the edges 215 of wafer 204, or the like.

Processing may continue with regions of the wafers being contacted to bond the regions and to initiate a bond between the wafers. For example, bonding small regions of the wafers (e.g., at a center of the wafers) may begin a bonding that will propagate a bond between the wafers radially out from the initially contacted center regions. In other embodiments, the relatively small regions of wafer brought into contact are at or near an edge of the wafers.

Figure 6:
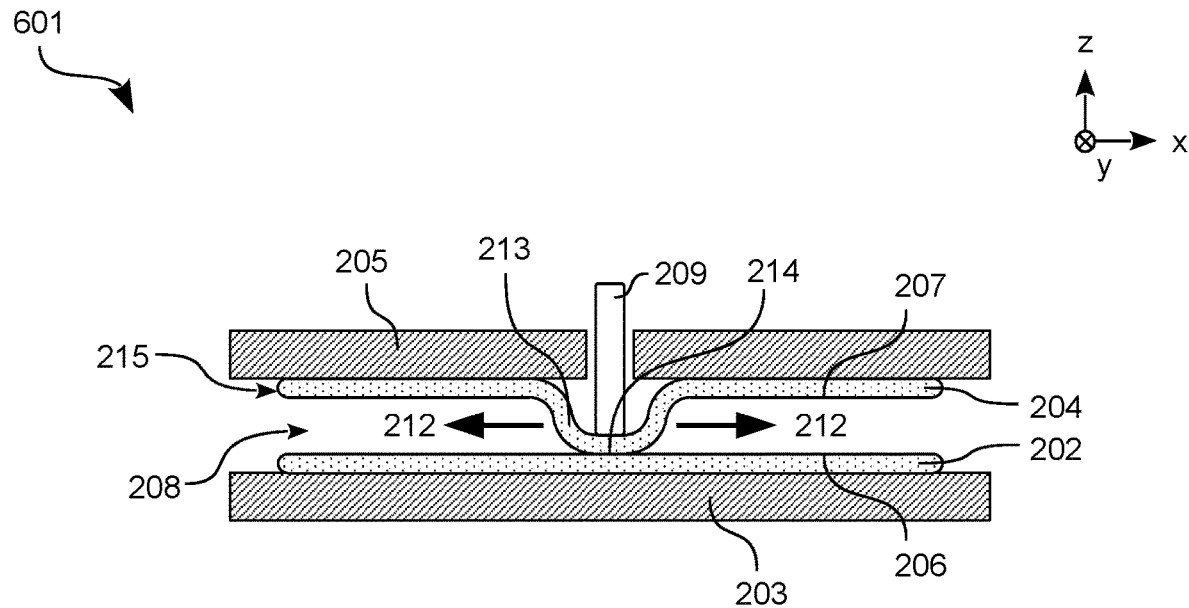

FIG. 6 illustrates a work piece arrangement 601 similar to work piece arrangement 501 after wafer deformer 209 has deformed a portion 213 of wafer 204 to bring a region of wafer 204 into contact with a region of wafer 202 at contact region 214, arranged in accordance with at least some implementations of the present disclosure. Wafer deformer 209 may include any suitable wafer deformer such as a pin or peg, as illustrated, a roller, or the like and wafer deformer 209 may deform wafer 204 using any suitable technique or techniques. As described, in other embodiments, the wafers may be contacted using air pressure to deform wafer 204 or warped chucks may be used or the like. In an embodiment, wafer deformer 209 deforms wafer 204 such that contact region 214 is at or about at center of wafer 202 and wafer 204. However, wafers 202, 204 may be contacted at any position on the wafers.

As shown in FIG. 6 with respect to arrows 212, after contact of contact region 214, wafers 202, 204 bond with a bond front progressing from contact region 214 to other regions of wafers 202, 204 (in the case of contacting center regions of wafers 202, 204, radially outward from the center). Such bonding causes distortion and/or stress between wafers 202, 204.

Processing may continue such that the bond initiated between regions of the wafers is propagated to complete the bond between surface 206 of wafer 202 and surface 207 of wafer 204. Since surfaces 206, 207 were brought into close proximity and the bond was initiated at the described local region (e.g., via a "point" contact), the bond may propagate outwardly (e.g., in the x-y directions) from the centers of wafers 202, 204 to complete the bond therebetween. For example after initial contact, the wafers may bond together under the attraction therebetween.

Figure 7:
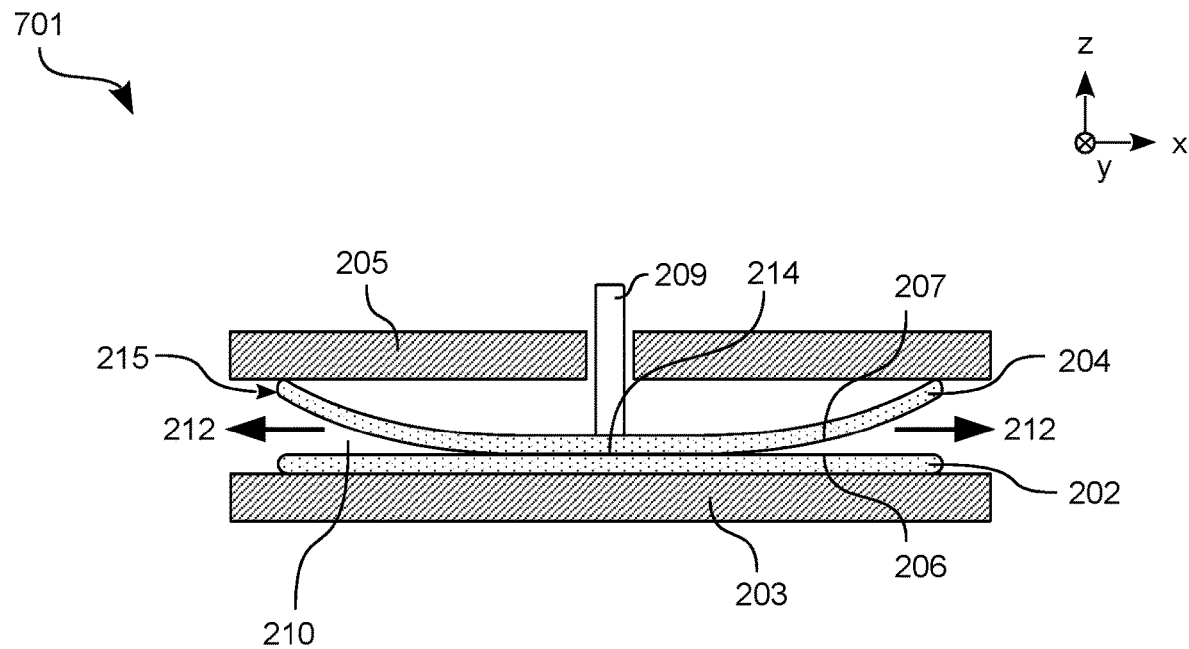

FIG. 7 illustrates a work piece arrangement 701 similar to work piece arrangement 601 as bonding between wafers 202, 204 propagates, arranged in accordance with at least some implementations of the present disclosure. The bonding between wafers 202, 204 may propagate due to attractive forces (e.g., van der Waals force, covalent bonding, hydrogen bonding, metallic bonding and/or the like) between surfaces 206, 207 for example.

As shown in FIG. 7, contact region 214 increases in size as the bond between surfaces 206, 207 propagates along a region 210 to complete the bond therebetween. Furthermore, as shown with respect to arrows 212, a bond front continues to move out and away from contact region 214 as the bond propagates. As described, such bonding causes distortion and/or stress between wafers 202, 204. In the illustrated embodiment, wafer 202 does not move during bonding while wafer 204 moves during bonding. In other embodiments, only wafer 204 may move or both wafers may move during bonding.

Figure 8:
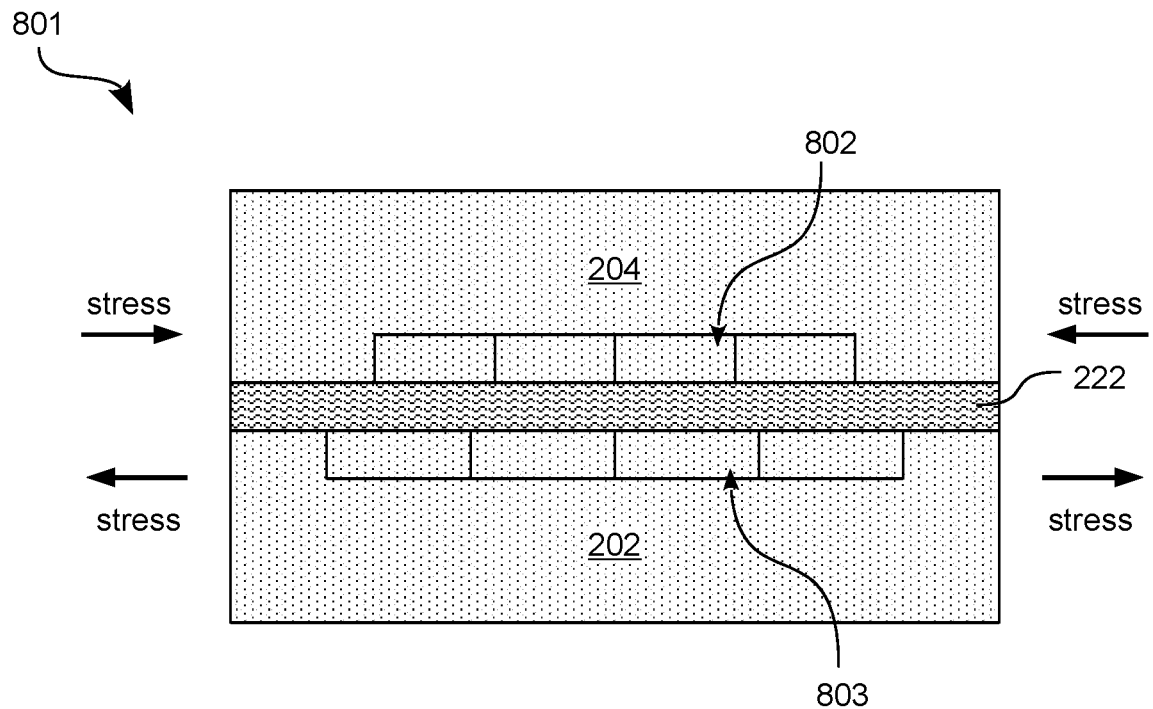
FIGS. 8 through 9 show cross-sectional side views each of a respective work piece arrangement during processing to bond wafers according to another embodiment.

FIG. 8 illustrates example stresses of a work piece arrangement 801 after bonding wafers 202, 204, arranged in accordance with at least some implementations of the present disclosure. As shown with respect to a grid 802 of wafer 204, wafer 204 may be under compressive stress after bonding with wafer 204. In addition, as shown with respect to grid 803 of wafer 202, wafer 202 may be under tensile stress after bonding. As described, such stresses may cause disadvantage in plane (i.e., in the x-y plane) distortion (IPD) of one or both of wafers 202, 204.

As shown in FIG. 8, wafers 202, 204 are dimensionally mismatched after bonding. Furthermore, after bonding, wafers 202, 204 are under stress, which may be in the range of about 0.1s of MPa or 100s of MPa.

Returning to FIG. 1, process 100 continues at operation 104, where the stress between the bonded wafers is relaxed via the compliant layer(s). In some embodiments, the compliant layer is heated to an elevated temperature with respect to the temperature of bonding to increase the compliancy and malleability of the compliant layer and thereby to relax the stress between the wafers. In other embodiments, stress relaxation may be achieved at room temperature (e.g., using longer relaxation durations). In embodiments where the compliant layer is heated, the compliant layer may be heated to any suitable temperature such that the compliant layer becomes malleable or compliant enough to relax the stress between the wafers. In an embodiment, the compliant layer is copper and is elevated to a temperature of about 400° C.

At such a temperature, copper exhibits stress relaxation via, for example, diffusional creep and/or dislocation plasticity.

The temperature of the compliant layer at operation 104 may be any suitable temperature depending on the material(s) implemented by the compliant layers. As described, in an embodiment, the compliant layer is heated to a temperature of not less than 400° C. In an embodiment, the compliant layer is heated to a temperature in the range of 300-400° C. In an embodiment, the compliant layer is heated to a temperature in the range of 200-300° C. In an embodiment, the compliant layer is heated to a temperature in the range of 400-500° C. In an embodiment, the compliant layer is left at room temperature. In an embodiment, the compliant layer is heated to temperature in the range of room-temperature (e.g., 20° C. to 25° C.) to 200° C. The compliant layer may be raised to the elevated temperature for any suitable duration such as 1 min to 1-8 hours or the like. In an embodiment in which the compliant layer is a polymer, after achieving stress and distortion relaxation, the compliant layer may be heated to higher temperatures to improve its mechanical strength (e.g., by crosslinking).

The compliant layer may be heated using any suitable technique or techniques such as via a heating element adjacent to or surrounding a chamber holding the bonded wafers, via a heating element in a wafer holder holding the bonded wafers, or the like. In an embodiment, the described operations 103 and 104 are performed in the same system or machine. In other embodiments, the described operations 103 and 104 are performed in separate systems or machines. The heating of the compliant layer may be characterized as an anneal, a reflow anneal, or the like.

With reference to FIG. 1, the compliant layer and the bonded wafers may be cooled to ambient temperature at operation 105. As described, operation 104 may release or relax the stress between the bonded wafers.

Figure 9:
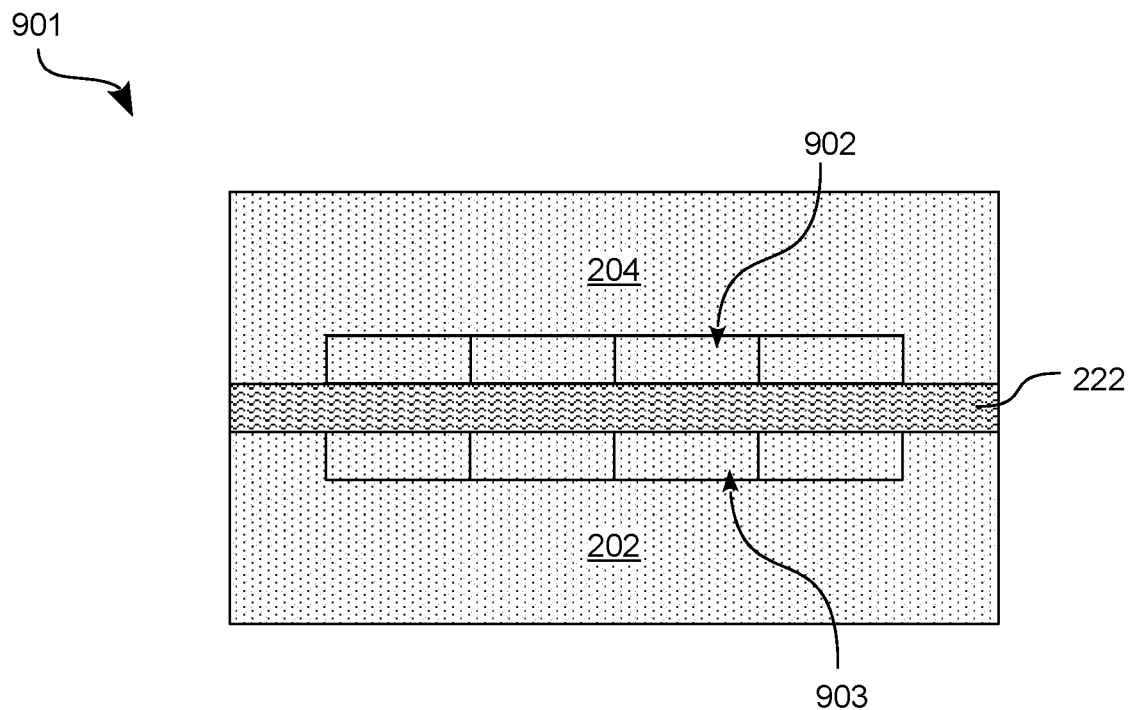

FIG. 9 illustrates example wafers 202, 204 in a work piece arrangement 901 after heating the compliant layer to remove or relax stresses therebetween, arranged in accordance with at least some implementations of the present disclosure. As shown with respect to a grid 902 of wafer 204 and grid 903 of wafer 202, wafers 202, 204 are no longer under stress. By resolving the stress between wafers 202, 204, in plane distortion (IPD) of one or both of wafers 202, 204 may be mitigated.

As shown in FIG. 9, wafers 202, 204 are dimensionally matched after relaxation of the stresses therebetween using compliant layer 222 as described.

Figure 10:
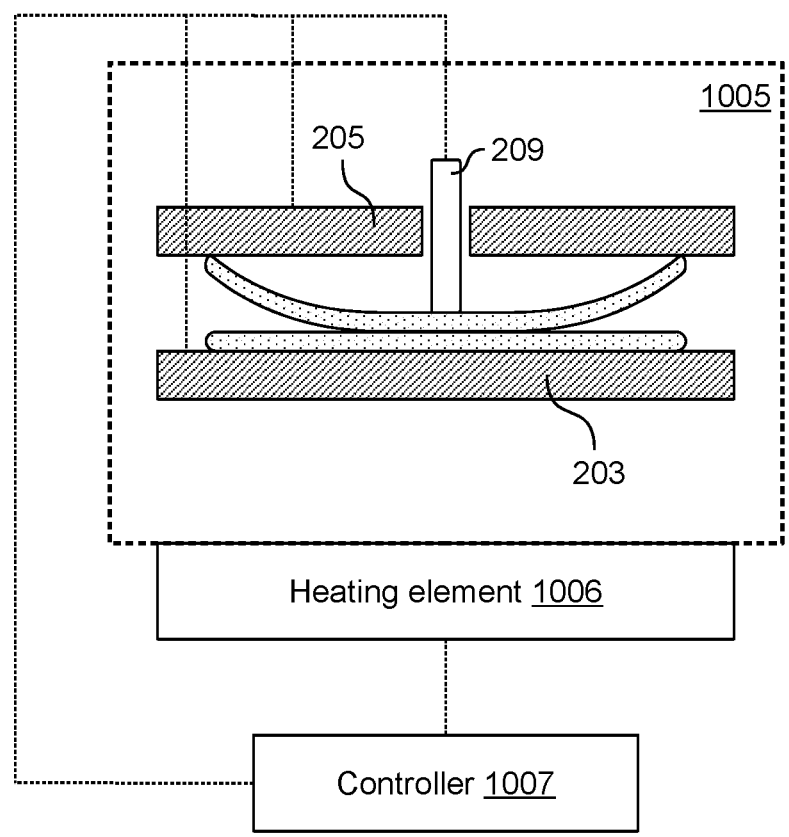
FIG. 10 illustrates a functional block diagram showing elements of a system to bond wafers according to an embodiment.

FIG. 10 illustrates an example system 1000 for bonding wafers using a compliant layer for reduced distortion, arranged in accordance with at least some implementations of the present disclosure. As shown in FIG. 10, system 1000 may include a chamber 1005 (or housing), a heating element 1006, and a controller 1007. Also as shown, system 1000 may include wafer holders 203, 205 and wafer deformer 209 within chamber 1005.

System 1000 may, under the control of controller 1007, perform any techniques described herein such as those described with respect to process 100. Any one or more of the operations of process 100 (or any other operations described herein) may be undertaken in response to instructions provided by one or more computer program products as implemented by controller 1007. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium. In an embodiment, controller 1007 is implemented as a computing device (or portions thereof) as described with respect to FIG. 11.

As shown, system 1000 may also include a heating element 1006 to heat a compliant layer after the bonding of wafers as described herein. In some embodiments, heating element 1006 may heat the entirety of chamber 1005. In some embodiments, heating element 1006 may provide local heating for the compliant layer by heating adjacent to the wafers. Heating element 1006 may include any suitable heating element or elements such as heat lamps or the like. For example, heating element 1006 may include a plurality of individually controllable heating elements. In the illustrated embodiment, heating element 1006 is at a bottom of chamber 1005. However, heating element may surround chamber 1005 or be provided at any portion of chamber 1005. In addition or in the alternative, one or both of wafer holders 203, 205 may include a heating element or elements to the compliant layer.

As shown, one or more of heating element 1006, wafer holders 203, 205 (optionally including heating elements in wafer holders 203, 205), and wafer deformer 209 are communicatively coupled to controller 1007 such that controller 1007 may receive information from such devices and/or control such devices via control signals to perform the operations described herein. For example, controller 1007 may provide control signals to heating element 1006 and/or heating elements to heat the compliant layer to any suitable temperature described herein. In addition or in the alternative, controller 1007 may provide control signals to wafer deformer 209 to initiate bonding between wafers as described herein.

Figure 11:
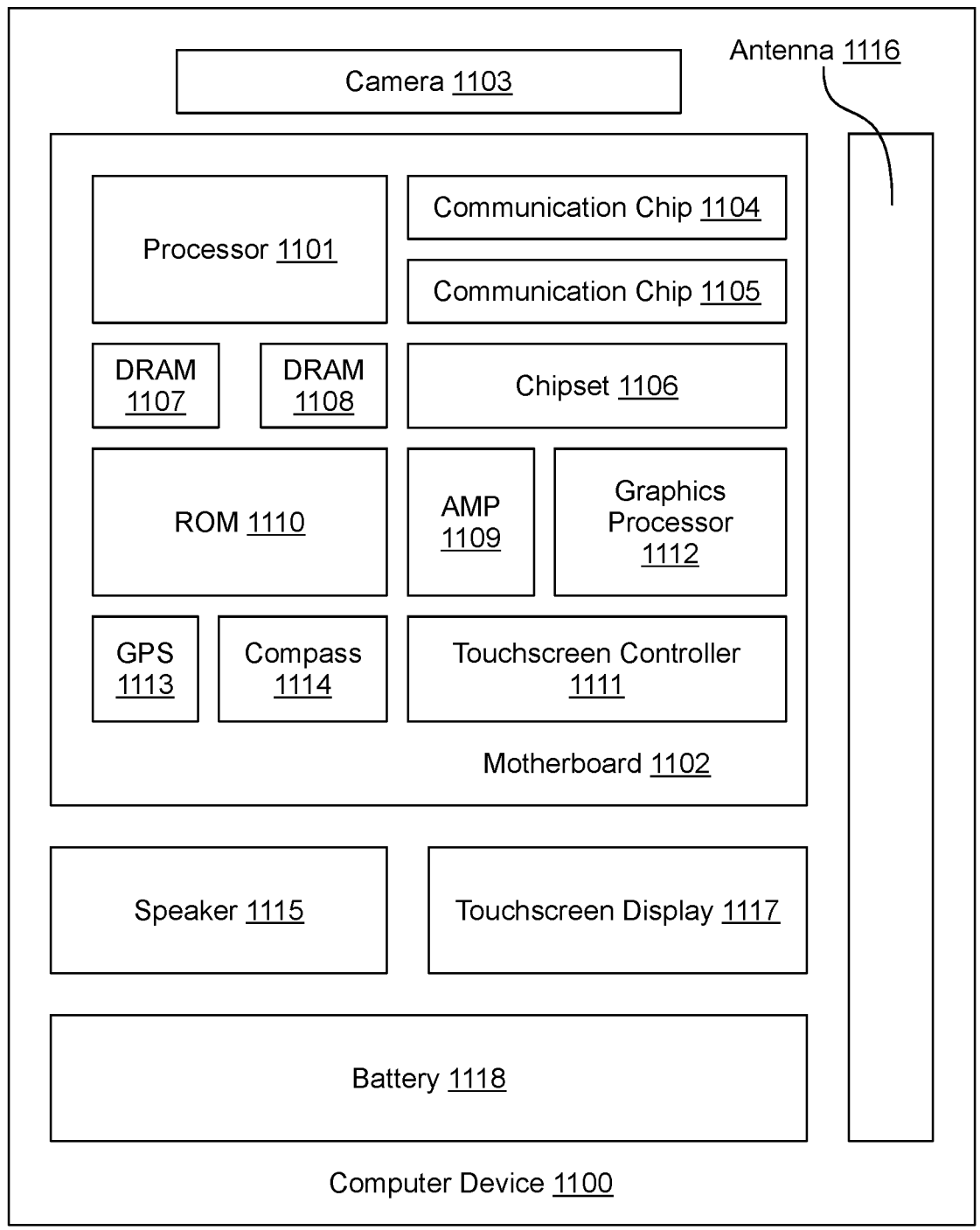
FIG. 11 illustrates a functional block diagram showing elements of a computing device in accordance with one embodiment.

FIG. 11 is a functional block diagram of a computing device 1100, arranged in accordance with at least some implementations of the present disclosure.

As described, computing device 1100 or portions thereof may be implemented as controller 1007. In some embodiments, computing device 1100 or portions thereof may be implemented via a mobile computing platform. As shown, computing device 1100 includes a motherboard 1102 hosting a number of components, such as, but not limited to, a processor 1101 (e.g., an applications processor, a microprocessor, etc.) and one or more communications chips 1104, 1105. Processor 1101 may be physically and/or electrically coupled to motherboard 1102. In some examples, processor 1101 includes an integrated circuit die packaged within the processor 1101. In general, the term "processor" may refer to any device or portion of a device that processes electronic data from registers and/or memory to transform that electronic data into other electronic data that may be stored in registers and/or memory.

In various examples, one or more communication chips 1104, 1105 may also be physically and/or electrically coupled to the motherboard 1102. In further implementations, communication chips 1104 may be part of processor 1101. Depending on its applications, computing device 1100 may include other components that may or may not be physically and electrically coupled to motherboard 1102. These other components may include, but are not limited to, volatile memory (e.g., DRAM) 1107, 1108, non-volatile memory (e.g., ROM) 1110, a graphics processor 1112, flash memory, global positioning system (GPS) device 1113, compass 1114, a chipset 1106, an antenna 1116, a power amplifier 1109, a touchscreen controller 1111, a touchscreen display 1117, a speaker 1115, a camera 1103, and a battery 1118, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. For example, touchscreen display 1117 may implement any emissive display device structure(s) described herein.

Communication chips 1104, 1105 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1104, 1105 may implement any of a number of wireless standards or protocols, including but not limited to those described elsewhere herein. As described, computing device 1100 may include a plurality of communication chips 1104, 1105. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. For example, one or both of communication chips 1104, 1105 may provide a wireless transceiver for computing device 1100. As described, touchscreen display 1117 of computing device 1100 may include or utilize one or more emissive display device structures described herein.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Figure 12:
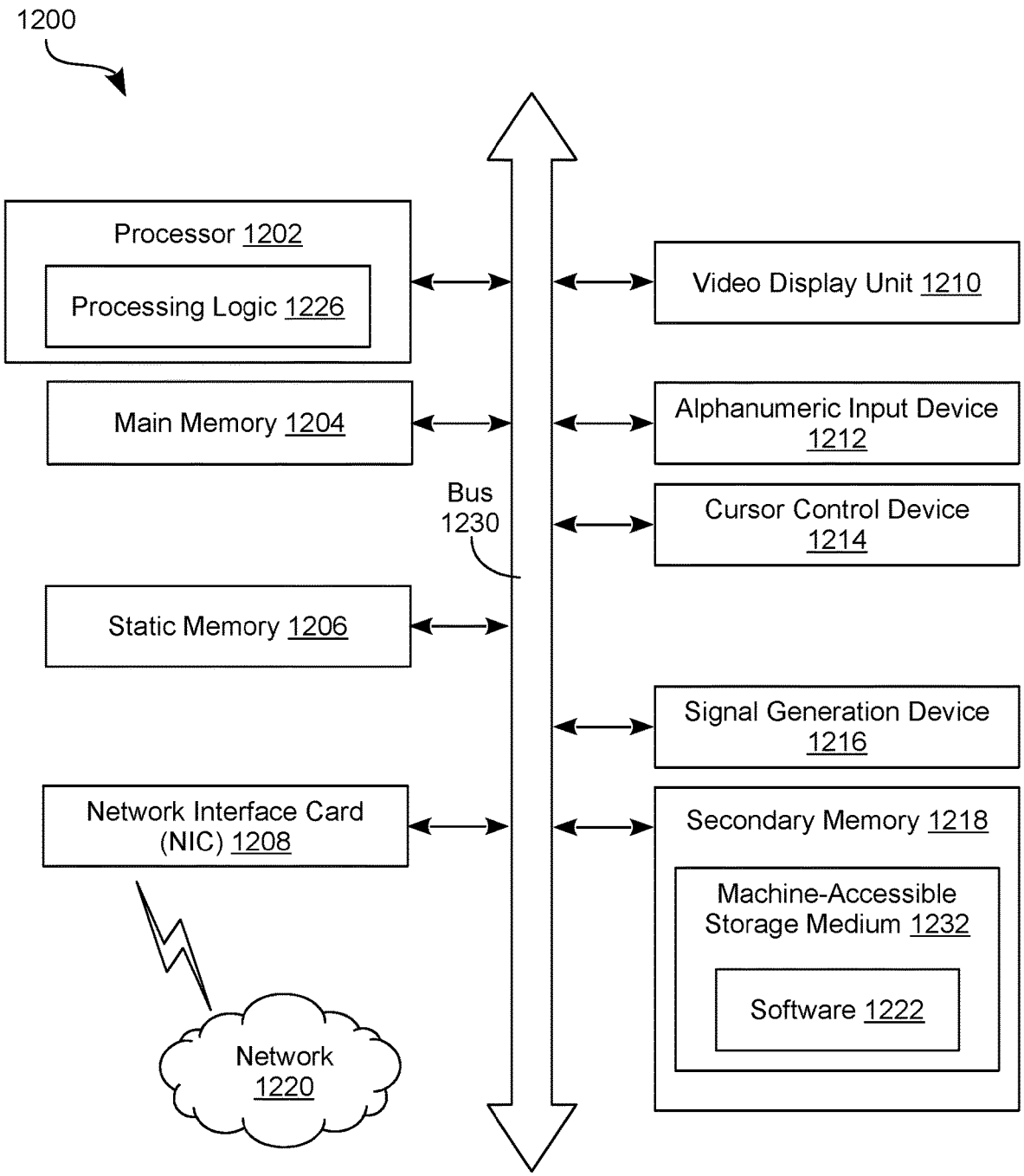
FIG. 12 illustrates a functional block diagram showing elements of an exemplary computer system, in accordance with one embodiment.

FIG. 12 illustrates a diagrammatic representation of a machine in the exemplary form of a computer system 1200 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1200 includes a processor 1202, a main memory 1204 (e.g., read-only memory (ROM), flash memory, dynamic random access memory (DRAM) such as synchronous DRAM (SDRAM) or Rambus DRAM (RDRAM), etc.), a static memory 1206 (e.g., flash memory, static random access memory (SRAM), etc.), and a secondary memory 1218 (e.g., a data storage device), which communicate with each other via a bus 1230.

Processor 1202 represents one or more general-purpose processing devices such as a microprocessor, central processing unit, or the like. More particularly, the processor 1202 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1202 may also be one or more special-purpose processing devices such as an application specific integrated circuit (ASIC), a field programmable gate array (FPGA), a digital signal processor (DSP), network processor, or the like. Processor 1202 is configured to execute the processing logic 1226 for performing the operations described herein.

The computer system 1200 may further include a network interface device 1208. The computer system 1200 also may include a video display unit 1210 (e.g., a liquid crystal display (LCD), a light emitting diode display (LED), or a cathode ray tube (CRT)), an alphanumeric input device 1212 (e.g., a keyboard), a cursor control device 1214 (e.g., a mouse), and a signal generation device 1216 (e.g., a speaker).

The secondary memory 1218 may include a machine-accessible storage medium (or more specifically a computer-readable storage medium) 1232 on which is stored one or more sets of instructions (e.g., software 1222) embodying any one or more of the methodologies or functions described herein. The software 1222 may also reside, completely or at least partially, within the main memory 1204 and/or within the processor 1202 during execution thereof by the computer system 1200, the main memory 1204 and the processor 1202 also constituting machine-readable storage media. The software 1222 may further be transmitted or received over a network 1220 via the network interface device 1208.

While the machine-accessible storage medium 1232 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for bonding wafers are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the description herein, it is appreciated that throughout the description, descriptions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

The following examples pertain to further embodiments.

In one or more first embodiments, a method for bonding wafers comprises providing a compliant layer on a first surface of a first wafer, bonding the compliant layer of the first wafer to a second surface of a second wafer, and relaxing a stress between the wafers induced by the bonding via the compliant layer.

In one or more second embodiments, for any of the first embodiments, relaxing the stress between the wafers comprises heating the compliant layer to an elevated temperature greater than a temperature of the bonding of the compliant layer and the second surface.

In one or more third embodiments, for any of the first embodiments, relaxing the stress between the wafers comprises maintaining the compliant layer at room temperature for a period of time to reduce the stress.

In one or more fourth embodiments, for any of the first through third embodiments, the compliant layer comprises one or more of a copper layer, an aluminum layer, a tin layer, an indium layer, a silver layer, a tin-silver alloy layer, a tin-copper alloy layer, or a tin-copper-silver alloy layer.

In one or more fifth embodiments, for any of the first through third embodiments, the compliant layer comprises a re-flowable oxide.

In one or more sixth embodiments, for any of the first through third embodiments, the compliant layer comprises a polymer.

In one or more seventh embodiments, for any of the first through sixth embodiments, the compliant layer is provided continuously over substantially the entirety of the first surface.

In one or more eighth embodiments, for any of the first through seventh embodiments, the compliant layer comprises a material stack comprising a metal layer on the first surface and a dielectric layer on the metal layer.

In one or more ninth embodiments, for any of the first through eighth embodiments, the second surface of the second wafer comprises a second compliant layer that, when heated to the elevated temperature exhibits plastic deformations.

In one or more tenth embodiments, for any of the first through ninth embodiments, the second surface of the second wafer comprises a second compliant layer that, when heated to the elevated temperature exhibits stress relaxation such that both the compliant layer and the second compliant layer comprise metal layers.

In one or more eleventh embodiments, for any of the first through tenth embodiments, the second surface of the second wafer comprises a second compliant layer that, when heated to the elevated temperature exhibits stress relaxation such that both the compliant layer and the second compliant layer comprise re-flowable oxide layers.

In one or more twelfth embodiments, for any of the first through eleventh embodiments, bonding the compliant layer to a second surface of a second wafer comprises bringing the compliant layer within close proximity of the second surface of the second wafer and contacting a first region of the compliant layer to a second region of the second surface to form a bond therebetween and propagating the bond to bond the compliant layer to the second surface.

In one or more thirteenth embodiments, a system comprises a controller including a computer readable medium, that, when implemented by a processor, instructs the system to perform any of the first through twelfth embodiments.

In one or more fourteenth embodiments, a system comprises a first wafer holder, a second wafer holder, a wafer deformer, a chamber housing both the first wafer holder and the second wafer holder, a heating element, and a controller controllably coupled to the heating element and the wafer deformer, the controller to provide signals to the heating element and the wafer deformer to perform any of the first through twelfth embodiments.

In one or more fifteenth embodiments, a system comprises a first wafer holder to hold a first wafer having a compliant layer on a first surface thereof, a second wafer holder to hold a second wafer having a second surface such that the second surface is in close proximity of the first surface, a wafer deformer to deform a portion of the first or second wafer to contact the compliant layer to the second surface, a heating element to heat the compliant layer, and a controller controllably coupled to the wafer deformer and the heating element, the controller to provide a first signal to the wafer deformer to deform the first wafer and to subsequently provide a second signal to the heating element to heat the compliant layer to an elevated temperature greater than a temperature of the contacting of the compliant layer and the second surface.

In one or more sixteenth embodiments, for any of the fifteenth embodiments, the compliant layer comprises a copper layer.

In one or more seventeenth embodiments, for any of the fifteenth or sixteenth embodiments, the compliant layer comprises one or more of an aluminum layer, a tin layer, an indium layer, a silver layer, a tin-silver alloy layer, a tin-copper alloy layer, or a tin-copper-silver alloy layer.

In one or more eighteenth embodiments, for any of the fifteenth embodiments, the compliant layer comprises a re-flowable oxide.

In one or more nineteenth embodiments, for any of the fifteenth through seventeenth embodiments, the compliant layer is provided continuously over substantially the entirety of the first surface.

In one or more twentieth embodiments, for any of the fifteenth through nineteenth embodiments, the compliant layer comprises a material stack comprising a metal layer on the first surface and a dielectric layer on the metal layer.

In one or more twenty-first embodiments, for any of the fifteenth through twentieth embodiments, the second surface of the second wafer comprises a second compliant layer that, when heated to the elevated temperature exhibits stress relaxation.

In one or more twenty-second embodiments, for any of the fifteenth through twenty-first embodiments, the second surface of the second wafer comprises a second compliant layer that, when heated to the elevated temperature exhibits stress relaxation such that both the compliant layer and the second compliant layer comprise metal layers.

In one or more twenty-third embodiments, for any of the fifteenth through twenty-second embodiments, the second surface of the second wafer comprises a second compliant layer that, when heated to the elevated temperature exhibits stress relaxation, such that both the compliant layer and the second compliant layer comprise re-flowable oxide layers.

What is claimed is:

1. A system for bonding wafers, the system comprising:
   a first wafer holder to hold a first wafer comprising a compliant layer on a first surface thereof, wherein the compliant layer comprises a material stack comprising a metal layer on the first surface and a dielectric layer on the metal layer;
   a second wafer holder to hold a second wafer comprising a second surface, wherein the second wafer is to hold the second surface in close proximity of the first surface;
   a wafer deformer to deform a portion of the first or second wafer to contact the compliant layer to the second surface;
   a heating element to heat the compliant layer; and
   a controller controllably coupled to the wafer deformer and the heating element, the controller to provide a first signal to the wafer deformer to deform the first wafer and to subsequently provide a second signal to the heating element to heat the compliant layer to an elevated temperature greater than a temperature of the contacting of the compliant layer and the second surface.

2. The system of claim 1, wherein the compliant layer comprises a copper layer.

3. The system of claim 1, wherein the compliant layer comprises one or more of an aluminum layer, a tin layer, an indium layer, a silver layer, a tin-silver alloy layer, a tin-copper alloy layer, or a tin-copper-silver alloy layer.

4. The system of claim 1, wherein the compliant layer comprises a re-flowable oxide.

5. The system of claim 1, wherein the compliant layer is provided continuously over substantially the entirety of the first surface.

6. The system of claim 1, wherein the second surface of the second wafer comprises a second compliant layer that, when heated to the elevated temperature, exhibits stress relaxation.

7. The system of claim 1, wherein the second surface of the second wafer comprises a second compliant layer that, when heated to the elevated temperature, exhibits stress relaxation, wherein both the compliant layer and the second compliant layer comprise metal layers.

8. The system of claim 1, wherein the second surface of the second wafer comprises a second compliant layer that, when heated to the elevated temperature, exhibits stress relaxation, wherein both the compliant layer and the second compliant layer comprise re-flowable oxide layers.

* * * * *